(12) United States Patent
Roh

(10) Patent No.: US 10,720,396 B2
(45) Date of Patent: Jul. 21, 2020

(54) SEMICONDUCTOR CHIP AND SEMICONDUCTOR PACKAGE HAVING THE SAME

(71) Applicant: Samsung Electronics Co., Ltd., Suwon-si, Gyeonggi-do (KR)

(72) Inventor: Jung-Hyun Roh, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/125,881

(22) Filed: Sep. 10, 2018

(65) Prior Publication Data

US 2019/0164910 A1 May 30, 2019

(30) Foreign Application Priority Data

Nov. 27, 2017 (KR) .................. 10-2017-0159658

(51) Int. Cl.
| | | |
|---|---|---|
| *H01L 23/00* | (2006.01) | |
| *H01L 23/544* | (2006.01) | |
| *H01L 27/108* | (2006.01) | |
| *H01L 27/11526* | (2017.01) | |
| *H01L 27/11573* | (2017.01) | |
| *H01L 21/66* | (2006.01) | |
| *H01L 25/10* | (2006.01) | |
| *H01L 25/065* | (2006.01) | |

(52) U.S. Cl.
CPC ............ *H01L 23/562* (2013.01); *H01L 22/30* (2013.01); *H01L 23/544* (2013.01); *H01L 25/0657* (2013.01); *H01L 25/105* (2013.01); *H01L 27/10897* (2013.01); *H01L 27/11526* (2013.01); *H01L 27/11573* (2013.01); *H01L 22/34* (2013.01); *H01L 2223/5446* (2013.01); *H01L 2223/54426* (2013.01); *H01L 2225/06513* (2013.01); *H01L 2225/06517* (2013.01); *H01L 2225/1035* (2013.01); *H01L 2225/1058* (2013.01)

(58) Field of Classification Search
CPC ........................... H01L 23/562; H01L 23/544
See application file for complete search history.

(56) References Cited

U.S. PATENT DOCUMENTS

| | | |
|---|---|---|
| 6,589,855 B2 | 7/2003 | Miyamoto et al. |
| 7,176,061 B2 | 2/2007 | Sasaki et al. |
| 7,400,028 B2 | 7/2008 | Tomita |
| 9,171,759 B2 | 10/2015 | Cheng et al. |

(Continued)

FOREIGN PATENT DOCUMENTS

| | | |
|---|---|---|
| JP | 2007-115988 A | 5/2007 |
| JP | 2008-270232 A | 11/2008 |

(Continued)

*Primary Examiner* — Trang Q Tran
(74) *Attorney, Agent, or Firm* — Harness, Dickey & Pierce, P.L.C.

(57) ABSTRACT

A semiconductor chip including a substrate including a plurality of chip areas and a line-shaped scribe area defining the chip areas, an integrated circuit (IC) structure on the chip area, the IC structure including a plurality of transistors and a plurality of stacked wiring structures connected to the transistors, and a warpage protector in the line-shaped scribe area and corresponding to the stacked wiring structures, the warpage protector supporting at least one side of the IC structure may be provided.

19 Claims, 8 Drawing Sheets

(56) References Cited

U.S. PATENT DOCUMENTS

| | | | |
|---|---|---|---|
| 9,406,625 | B2 | 8/2016 | Wang et al. |
| 2007/0048969 | A1* | 3/2007 | Kwon ............... H01L 21/76898 |
| | | | 438/455 |
| 2014/0319522 | A1* | 10/2014 | Daubenspeck ......... H01L 24/11 |
| | | | 257/48 |
| 2016/0268217 | A1* | 9/2016 | Konomi ................ H01L 23/562 |

FOREIGN PATENT DOCUMENTS

| | | |
|---|---|---|
| KR | 10-0694420 B1 | 3/2007 |
| KR | 10-0696762 B1 | 3/2007 |
| KR | 10-2009-0043112 A | 5/2009 |

\* cited by examiner

SEMICONDUCTOR CHIP AND SEMICONDUCTOR PACKAGE HAVING THE SAME

CROSS-REFERENCE TO RELATED APPLICATIONS

This application claims priority under 35 U.S.C § 119 to Korean Patent Application No. 10-2017-0159658 filed on Nov. 27, 2017 in the Korean Intellectual Property Office, the contents of which are incorporated by reference herein in its entirety.

BACKGROUND

1. Field

Example embodiments relate to semiconductor chips and/or semiconductor packages having the same, and more particularly, to semiconductor chips having a chip warpage protector and/or semiconductor packages having the same.

2. Description of the Related Art

In order to satisfy the needs for smaller size and higher performance in semiconductor devices, high degree of integration is desired. Generally, the high degree of integration of the semiconductor devices can be accomplished using a chip stack technology (e.g., stacking bare semiconductor chips) and/or using a package stack technology (e.g., stacking semiconductor packages).

Due to inherent limitations of stacking bare chips, the package stack technology has become more popular. For example, the package stack technology has been introduced for increasing capacity and performance of various apparatus and system including the chips. Further, the multi-chip package, in which multiple semiconductor chips are integrated onto a unifying substrate, has been suggested for increasing capacity and performance of the semiconductor package.

The multi-chip package is usually manufactured by stacking a plurality of chips on a circuit board and a molding process for fixing a plurality of the stacked chips to the board. Thus, the warpage defects may occur in every unit processes of the stacking process or other processes. For example, the warpage to the chip frequently may occur in a back grinding process of the substrate for the stacking process, and also may occur in the molding process due to the difference of the thermal expansions between the circuit board and the mold layer.

Recently, as the capacity and performance of the bare chip increases, various wirings are desired in the bare chip and the number of the insulation interlayers tends to increase in the back-end-of-line (BEOL) process of the semiconductor manufacturing process. Because the warpage in the bare chip rapidly increases due to the thermal expansion differences between the insulation interlayers, various packing defects can occur in the wafer level packaging process or the chip level packaging process.

Accordingly, the warpage in the bare chip (interior warpage) as well as the warpage between the chip and the board (exterior warpage) should be reduced.

SUMMARY

Some example embodiments of the present inventive concepts provide semiconductor chips having a warpage protector for preventing the inner warpage therein.

Some example embodiments of the present inventive concepts provide semiconductor packages having the above semiconductor chip.

According to an example embodiments of the present inventive concepts, a semiconductor chip includes a substrate including a plurality of chip areas and a line-shaped scribe area defining the chip areas, an integrated circuit (IC) structure on the chip area, the IC structure including a plurality of transistors and a plurality of stacked wiring structures connected to the transistors, and a warpage protector in the line-shaped scribe area and corresponding to the stacked wiring structures, the warpage protector supporting at least one side of the IC structure.

According to an example embodiments of the present inventive concepts, a semiconductor package includes a circuit board including an electric circuit pattern, a first semiconductor chip on the circuit board and electrically connected to the circuit board, and a second semiconductor chip on the first semiconductor chip and electrically connected to the first semiconductor chip. Each of first and the second semiconductor chips includes a substrate including a plurality of chip areas and a line-shaped scribe area defining the chip areas, an integrated circuit (IC) structure on the chip area, the IC structure including a plurality of transistors and a plurality of stacked wiring structures connected to the transistors, and a warpage protector in the line-shaped scribe area and corresponding to the stacked wiring structures, the warpage protector supporting at least a side of the IC structure.

According to an example embodiments of the present inventive concepts, a semiconductor package includes a mother board including an electronic circuit pattern, a system on chip (SoC) package on the mother board, the SOC package including an operational chip, the operational chip including one or more microprocessors, and a multichip package on the SoC package, the multichip package including a controller and at least one memory chip. Each of the operational chip and the memory chip includes a substrate including a plurality of chip areas and a line-shaped scribe area defining the chip areas, an integrated circuit (IC) structure on the chip area, the IC structure including a plurality of transistors and a plurality of stacked wiring structures connected to the transistors, and a warpage protector in the line-shaped scribe area and corresponding to the stacked wiring structures, the warpage protector supporting at least one side of the IC structure.

As the number and stack height of metal wirings in a semiconductor chip tends to increase to achieve improved performance and reduced size, the chip warpage of the semiconductor chip tends to increase significantly. Thus, the conventional semiconductor chips individually cut from the wafer may be distorted or changed in shape, thereby causing significant package defects in the subsequent packaging process for manufacturing the semiconductor package having the conventional bare chips.

However, according to some example embodiment of the semiconductor chips, the warpage protector enclosing and integrally combined to the semiconductor chip may sufficiently protect or mitigate such chip warpage from occurring, thereby significantly improving bonding stability of the bare chips and raising package reliability of the semiconductor package having the semiconductor chips.

BRIEF DESCRIPTION OF THE DRAWINGS

These and other features of the inventive concepts will become more apparent by describing in detail some example embodiments thereof with reference to the accompanying drawings of which.

DETAILED DESCRIPTION

Figure 1:
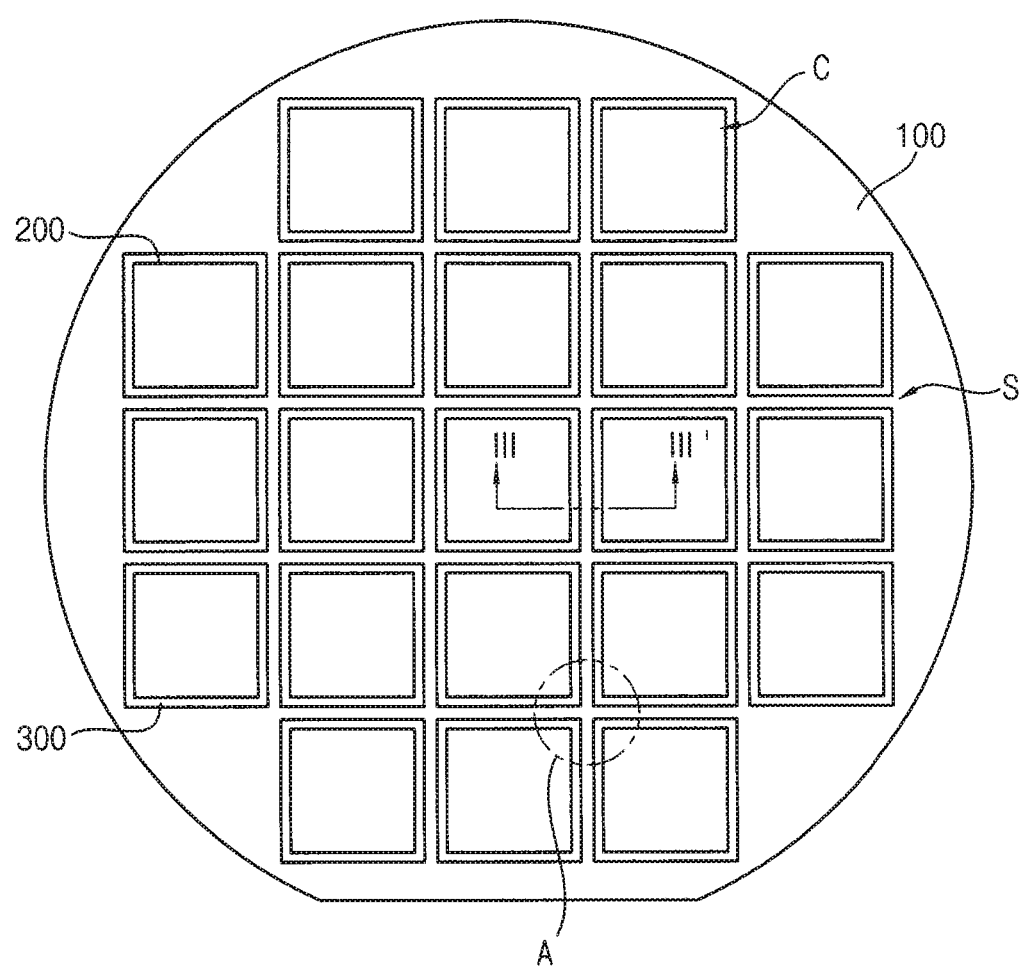
FIG. 1 is a plan view of a substrate on which a plurality of semiconductor chips in accordance with an example embodiment of the present inventive concepts.

Reference will now be made to some example embodiments, which are illustrated in the accompanying drawings, wherein like reference numerals may refer to like components throughout.

Figure 2:
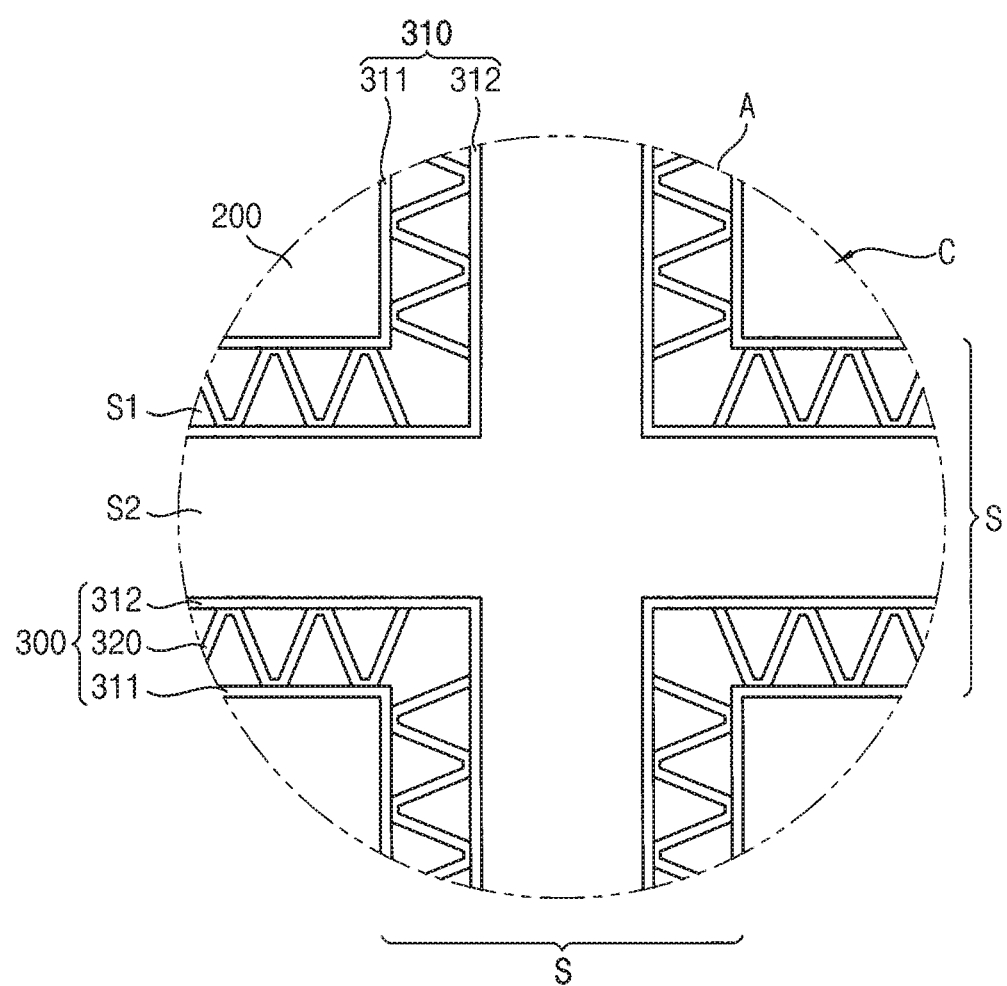
FIG. 2 is an enlarged view of a portion A of the substrate shown in FIG. 1.
Figure 3:
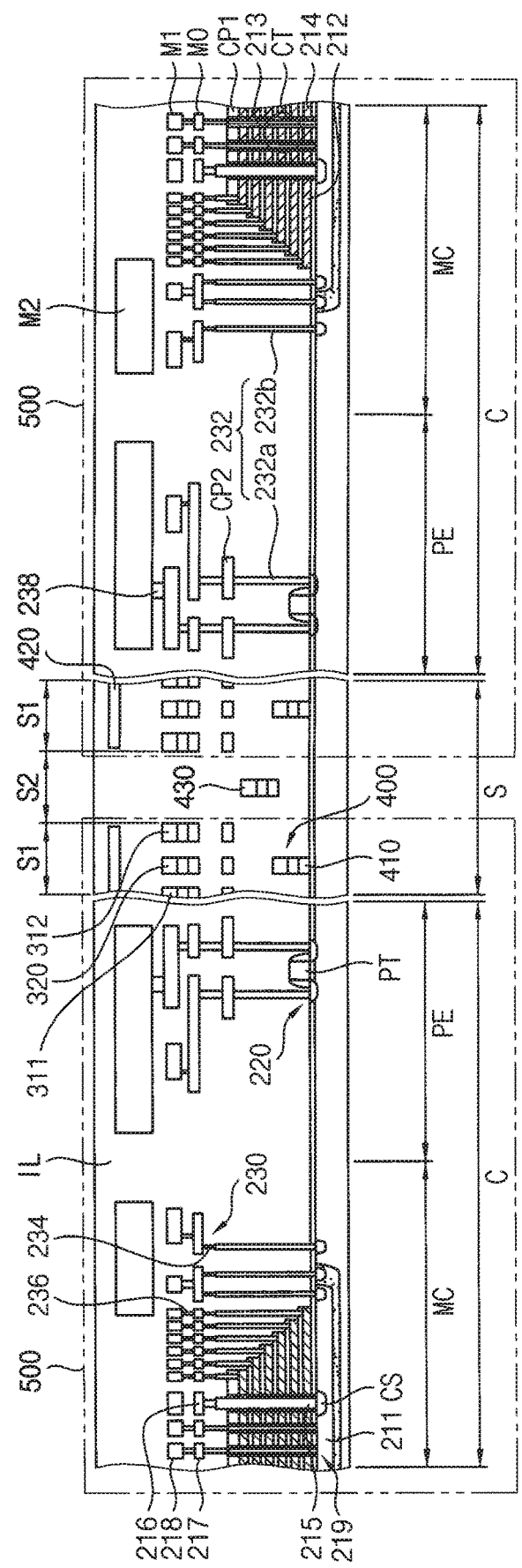
FIG. 3 is a cross sectional view cut along a line III-III' of FIG. 1.
Figure 4:
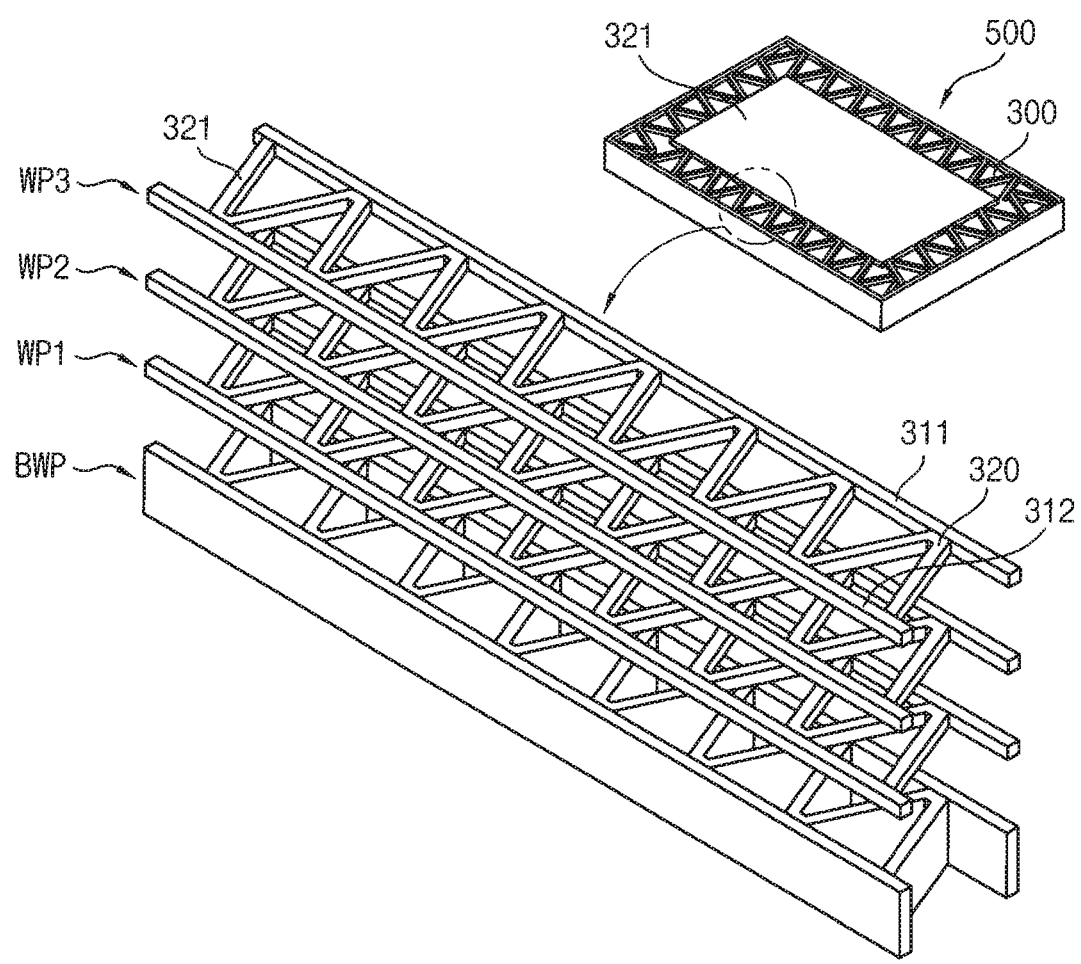
FIG. 4 is a perspective view illustrating the semiconductor chip that is separated from the substrate and enclosed by a warpage protector.

FIG. 1 is a plan view of a substrate on which a plurality of semiconductor chips in accordance with an example embodiment of the present inventive concepts. FIG. 2 is an enlarged view of a portion A of the substrate shown in FIG. 1. FIG. 3 is a cross sectional view cut along a line III-III' of FIG. 1, and FIG. 4 is a perspective view illustrating the semiconductor chip that is separated from the substrate and enclosed by a warpage protector.

Referring to FIGS. 1 to 4, a semiconductor chip 500 in accordance with an example embodiment of the present inventive concepts may include a substrate 100 having a plurality of chip areas C and a line-shaped scribe area S defining the chip areas C, an integrated circuit (IC) structure 200 arranged on the chip area and having a plurality of transistors and a plurality of stacked wiring structures connected to the plurality of transistors and a warpage protector 300 arranged in the scribe line S and supporting a side of the IC structure 200 to thereby prevent the IC structure 200 from a warpage.

For example, the substrate 100 may include a semiconductor substrate such as a silicon substrate, a germanium substrate, a silicon-germanium substrate, a silicon-on-insulator (SOI) substrate and a germanium-on-insulator (GOI) substrate.

The substrate 100 may include a plurality of the chip areas C on each of which the integrated circuit (IC) chip 200. The neighboring chip areas may be separated from each other by the scribe area S.

The chip area C may have a memory cell area MC in which at least a memory cell 210 having at least a cell transistor CT may be arranged and a peripheral area PE in which at least a peripheral circuit device having at least a peripheral transistor PT may be arranged and may operate the memory cell 210.

The chip area C may include a plurality of active regions (not shown) defined by a device isolation layer (not shown) and the cell transistor CT and the peripheral transistor PT may be located on the active region. Thus, the neighboring cell transistors and the neighboring peripheral transistors may be separated from each other by the device isolation layer.

A plurality of the memory cells 210 may be arranged on the memory cell area MC and may be isolated from surroundings by an insulation layer IL. The isolated memory cells 210 may be connected to surroundings via the wiring structures 230. The wiring structure 230 may include a conductive contact and a metal wiring and may be contact with the memory cell 210 through the insulation layer IL.

The memory cell 210 may have various structures according to the configurations and requirements of semiconductor devices. For example, a plurality of the memory cells 210 may be vertically stacked on the memory cell area MC as a 3-dimenional vertical memory device. The vertical memory device may include a gate stack 212 having a plurality of gate electrodes that may be stacked on a pocket well 211 doped with n-type or p-type doping materials, a vertical channel 213 connected to the pocket well 211 through the gate stack 212 and a cylindrical charge storage layer 214 interposed between the vertical channel 213 and the gate stack 212 along the vertical channel 213. A common source CS in the pocket well 211 may be connected to a common source line 216 corresponding to a lowermost wiring M0 of the stacked wiring structure via a common source plug 215. The vertical channel 213 may be connected to a bit line 218 corresponding to a middle wiring M1 of the stacked wiring structure via a bit line contact pad 217 corresponding to the lowermost wiring M0 of the stacked wiring structure.

A string of the lowermost gate electrodes of the gate stack 212 may be provided as a ground selection line (GSL) and a string of the uppermost gate electrodes of the gate stack 212 may be provided as a string selection line (SSL). A plurality of the gate electrodes of the gate stack 212 interposed between the GSL and the SSL may be provided as a plurality of word lines, so that the vertical memory device may function as a vertical NAND memory device. The GSL, the word lines and the SSL may be sequentially stacked into a step shape on the substrate 100 and may be individually connected to a cell connection plug 232b at each end portion thereof. A plurality of the gate electrodes of the gate stack 212 around the vertical channel 213 may be provided as a single cell string 219.

In addition, the memory cell 210 may include a buried channel transistor (BCAT) in which a gate electrode may be buried into the substrate 100 and a capacitor (not shown) for storing data as a dynamic random access memory (DRAM) device. In some example embodiments, the memory cell 210 may also include a fin type gate electrode protruded from the substrate.

At least an operating device 220 operating the memory cell 210 may be arranged on the peripheral area PE of the chip area C and may be insulated from surroundings by the insulation layer IL. The operating device 220 may include at least the peripheral transistor PT, which may be electrically insulated from each other by the insulation layer IL, and the wiring structure 230 that may be connected to the peripheral transistor PT through the insulation layer IL.

The wiring structure 230 may include a lowermost metal wiring M0, at least a middle metal wiring M1, and an uppermost metal wiring M2 that may be insulated from one another by the insulation layer IL. The lowermost metal wiring M0 may be connected to the memory cell 210 and the operating device 220 via a lower contact 234 and may be connected to the middle metal wiring M1 via an upper contact 236. The middle metal wiring M1 may be connected to the upper metal wiring M2 via a via structure 238. The middle metal wiring M1 may be provided as a single layer structure or a multilayer structure according to the configurations of the IC structure 200.

At least a connection plug 232 may be selectively provided on the semiconductor chip 500 according to the structures and configurations of the memory cell 210 for the electrical connection between lower contact 234 and the substrate 100, the memory cell 210 and the operating device 220. In the present example embodiment, the connection plug 232 may include a peripheral connection plug 232a connecting the peripheral transistor PT and the lowermost metal wiring M0, and a cell connection plug 232b connected to the pocket well 211 and individually contact the SSL, the GSL and the word lines.

Because there is a relatively high stepped portion between the memory cell area MC and the peripheral area PE of the substrate due to the stack structure of the memory cell 210 and/or the capacitor, the peripheral connection plug 232a may be divided into an upper portion and a lower portion by a contact pad CP2. The contact pad CP2 in the peripheral area PE may have the same structure as a capping pattern CP1 covering the gate stack 212 in the memory cell area MC.

The lowermost metal wiring M0 may function as a bit line contact pad 217 and the common source line 216 in the memory cell area MC, and may function as a drain contact plug connected to the peripheral transistor PT. The middle metal wiring M1 may function as a bit line 218 connected to a cell transistor in the memory cell area MC and may function as a source contact plug connected to the peripheral transistor PT.

The functions and configurations of the lowermost and the middle metal wirings M0 and M1 may vary according to the structures of the memory cell 210. For example, when the memory cell 210 may be configured to a DRAM device having a BCAT structure, a bit line of the DRAM device may be connected to the lowermost metal wiring M0 and a common source line of the DRAM device may be connected to the middle metal wiring M1.

The driving power may be applied to the IC structure 200 via the uppermost metal wiring M2.

An external power source (not shown) and an external signal source (not shown) may be connected to the uppermost metal wiring M2 and may be transferred to the middle metal wiring M1 and the lowermost metal wiring M2 that may be separated from each other by the insulation layer IL. Thus, a power signal, a ground signal, and a data signal may be transferred to the memory cell 210 and the operating device 220 via the uppermost metal wiring M2, the middle metal wiring M1, and the lowermost metal wiring M0 from the power source and the external signal source. Thereafter, the memory cell 210 may be operated in response to a driving signal in accordance with a control routine of the operating device 220.

The scribe area S may be shaped into a line, and may also be referred to as scribe line S, for separating the IC chips 200 that may be arranged into a matrix on the substrate 100, and may function as a dicing line for cutting the IC chips into individual pieces. Further, the scribe area S may function as a spare space for a manufacturing process of the semiconductor chip 500 and various subsidiary patterns 400 may be arranged in the scribe area S in the manufacturing process of the semiconductor chip 500 and in the packaging process using the semiconductor chip 500.

When the manufacturing process of the IC structure 200 on the substrate 100 is completed, the IC chips 200 may be separated into pieces by a dicing process. For example, the substrate 100 may be cut along the scribe line S by a cutter such as a laser blade, and thus the IC chips 200 on the chip area C may be separated into pieces. Each of the separated IC structure 200 may be referred to as a bare chip.

The scribe area S may include a kerf area S2 along which the cutter may pass and a buffer area S1 around the kerf area S2. The kerf area S2 may be cut by the cutter such that the IC chips 200 on the chip area C may be separated (e.g., diced) into the bare chip and the buffer area S1 may still remain around the bare chip.

A preliminary pattern or layer (not shown) for facilitating the cutting of the substrate 100 may be provided in the kerf area S2, thus the substrate 100 may be rapidly and efficiently separated into pieces without any substantial stresses and strains to the IC structure 200. Therefore, the dicing damage to the IC structure 200 may be minimized due to the preliminary pattern or layer in the kerf area S2.

The subsidiary patterns may be selectively provided in the buffer area S1 for facilitating the manufacturing process of the IC chips 200 and/or the packaging process for packaging the semiconductor chips 500 into a semiconductor package.

For example, a test element group (TEG) pattern 410 may be formed in the buffer space S1 of the scribe line S for inspecting the process defects of a front-end-of-line (FEOL) process for forming transistors of the memory cell 210 and the operating device 220 and a back-end-of-line (BEOL) process for forming the wiring structure 230. Further, an aligning key 420 for aligning bonded upper and lower chips in the packaging process, a photo key (not shown) for aligning a center position of a photolithography process in the BEOL process and the FEOL process and an optimal critical dimension (CD) inspection pattern 430 for inspecting thickness and uniformity of a layer and a gap distance between neighboring patterned lines may also be provided in the kerf area S2 of the scribe line S.

For example, the preliminary pattern or layer for facilitating the cutting of the substrate 100 and the aligning key 420 may be arranged at a top portion of a substrate structure having the semiconductor chip 500 in the buffer area S1 and the other subsidiary patterns 400 such as the photo key, the TEG pattern 410 and the inspection pattern 430 may be arranged under the preliminary pattern or layer and the aligning key 420 in the scribe line S regardless of the buffer area S1 and the kerf area S2. In the present example embodiment, the CD inspection pattern 430 may be arranged in the kerf area S2 in a lower portion or a middle portion of the substrate structure having the semiconductor chip 500.

For example, the warpage protector 300 may be arranged in the buffer area S1 and support the side of the IC structure 200, thereby mitigating or preventing the warpage or deflection of the IC structure 200.

The warpage protector 300 may be integrally provided with the IC structure 200 in one body and may generate an external force in response to an internal stress of the IC structure 200. Thus, the deflection or the warpage of the IC structure 200 caused by the internal stress may be protected by the warpage protector 300. Because the warpage protector 300 may still remain around the IC structure 200 after the dicing process, the warpage of the IC structure 200 or the bare chip may be sufficiently protected or mitigated by the warpage protector 300.

For example, as the stack number of the wiring structure 230 increases in the semiconductor chip 500, the thermal expansion difference may also increase between the wiring structure 230 and the insulation layer IL. Further, the thermal expansion difference between an upper portion and a lower portion of the IC structure 200 may occur due to the height difference between the memory cell area MC and the peripheral area PE in the semiconductor chip 500. Thus, the warpage of the IC structure 200 by itself (hereinafter, referred to as chip warpage) may increase due to the thermal expansion differences between the wiring structure 230 and the insulation layer IL and between the upper portion and the lower portion of the IC structure 200. Accordingly, the IC structure 200 (e.g., the bare chip) separated by the dicing process may be distorted in shape due to the chip warpage, thereby causing significant process defects in a subsequent chip stack package process.

The warpage protector 300 may be contact with the side of the IC structure 200, and may sufficiently prevent or minimize the shape distortion of the bare chip such that the internal stress or strain may be restricted by the reaction forces of the warpage protector 300. Therefore, a pair of the separated IC chips 200 may be accurately bonded to each other with high stability, thereby increasing the reliability of the multichip package.

For example, the warpage protector 300 may include a frame 310 in contact with the side of the IC structure 200 and a support pattern 320 continuously arranged along the frame 310.

The frame 310 may directly contact the side of the IC structure 200 and include a pattern area therein and the support pattern 320 may be arranged in the pattern area of the frame 310. Thus, the IC structure 200 may be directly supported by the frame 310 and the support pattern 320 may generate the external forces together with the frame 310 in response to the internal stress of the bare chip. Accordingly, the warpage protector 300 may generate a external force sufficient to protect or mitigate the distortion or the warpage of the IC structure 200.

For example, the frame 310 may include a first bar 311 that directly contacts the side of the IC structure 200 and a second bar 312 spaced apart from and in parallel with the first bar 311. A gap space between the first and the second bars 311 and 312 may be provided as the pattern area of the frame 310, and the support pattern 320 may be arranged in the pattern area as a bridge pattern for connecting the first and second bars 311 and 312. That is, the support pattern 320 may contact both of the first and second bars 311 and 312.

In the present example embodiment, the support pattern 320 may include a plurality of slant lines 321 that may be slanted at a slant angle with respect to the first and the second bars 311 and 312, and may continuously and alternately contact the first and second bars 311 and 312 in a zigzag pattern. Thus, the support pattern 320 may be shaped into a plurality of triangular patterns, and the IC structure 200 may be enclosed by a triangular trust ring that may be defined by the first and the second bars 311 and 312. That is, the warpage protector 300 may be provided as a warpage prevention ring defined by the first and the second bars 311 and 312 around the IC structure 200.

The warpage protector 300 may have various structures and configurations according to the stress distributions in the IC structure 200.

Figure 5:
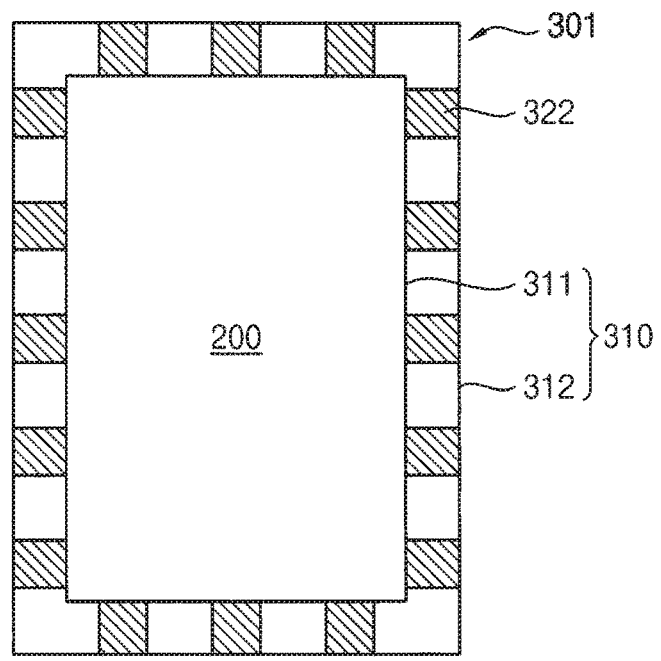
FIG. 5 is a plan view illustrating a first modification of the warpage protector shown in FIG. 4.

FIG. 5 is a plan view illustrating a first modification of the warpage protector shown in FIG. 4.

Referring to FIG. 5, the warpage protector 300 may be modified into a first modified warpage protector 301 such that the support pattern 320 may include a plurality of vertical lines 322 vertically extending from the first bar 311 to the second bar 312, and spaced apart by the same gap distance along the side of the IC structure 200.

Thus, the support pattern 320 (e.g., the plurality of vertical lines 322) of the first modified warpage protector 301 may be shaped into a plurality of rectangular patterns in the pattern area of the frame 310 in a ladder pattern, and the IC structure 200 may be continuously enclosed by a rectangular trust ring defined by the first and the second bars 311 and 312. That is, the first modified warpage protector 301 may be provided as a ladder shaped rectangular warpage prevention ring defined by the first and the second bars 311 and 312 around the IC structure 200.

For example, the warpage protector 300 or the first modified warpage protector 301 may be arranged continuously along the side of the IC structure 200, and mainly enclose the wiring structure 230 having a plurality of stacked metal wirings and insulation interlayers for isolating the stacked metal wirings. In such a case, some of the subsidiary patterns 400 (e.g., the TEG pattern 410 for inspecting the process defects of the BEOL process) may not be arranged in the buffer area S1. The TEG pattern 410 may be arranged in the chip area C.

In a case that the warpage protector 300 is discontinuously arranged along the side of the IC structure 200, the subsidiary pattern 400 may still be arranged in the buffer area S1.

Figure 6:
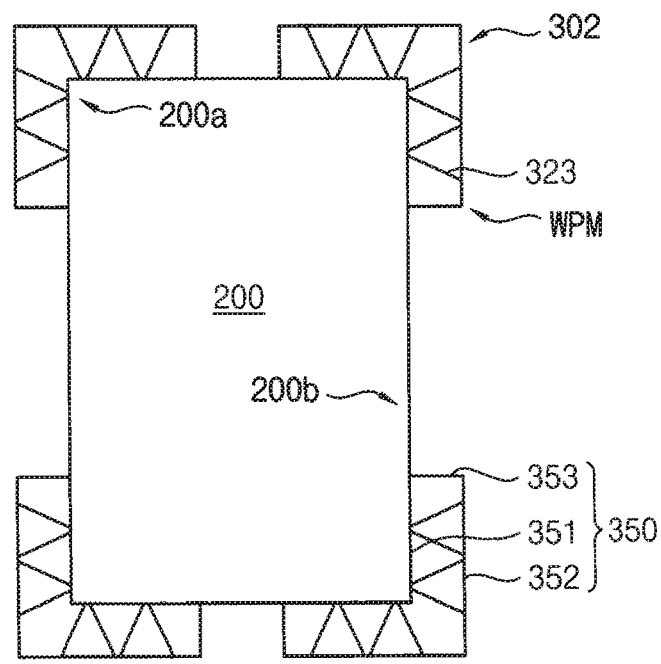
FIG. 6 is a plan view illustrating a second modification of the warpage protector shown in FIG. 4.
Figure 7:
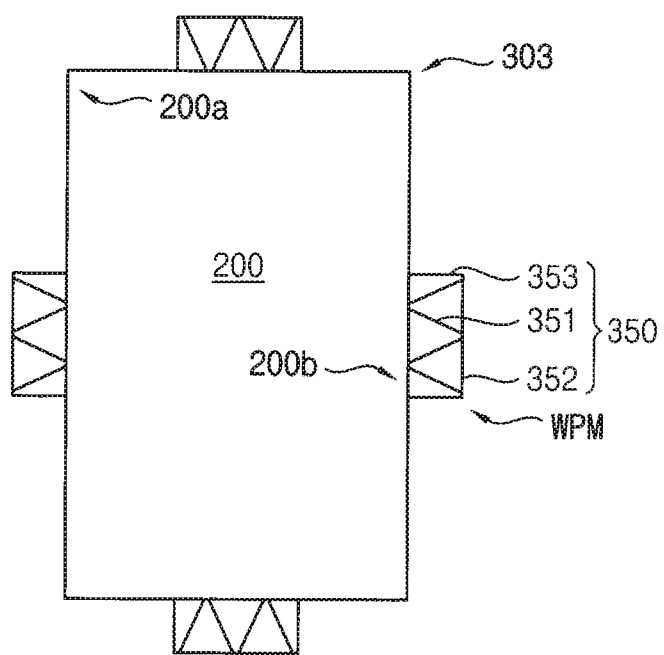
FIG. 7 is a plan view illustrating a third modification of the warpage protector shown in FIG. 4.

FIG. 6 is a plan view illustrating a second modification of the warpage protector shown in FIG. 4, and FIG. 7 is a plan view illustrating a third modification of the warpage protector shown in FIG. 4.

Referring to FIG. 6, the warpage protector 300 may be modified into a second modified warpage protector 302 such that the frame 310 may be modified into a plurality of isolated frames 350 partially contacting the IC structure 200 and including a pattern area therein, and the support pattern 320 may be modified into a plurality of isolated slant lines 323 in the pattern area of the isolated frame 350.

For example, the isolated frame 350 may include first and second isolated bars 351 and 352 spaced apart in parallel with each other and a pair of connecting bars 353 for connecting the first and second isolated bars 351 and 352 at end portions thereof. For example, the isolated frames 350 may be arranged sporadically along the side of the IC structure 200, so the IC structure 200 may be discontinuously enclosed by the isolated frames 350.

The support pattern 320 may have substantially the same structures as the slant lines 321 of the warpage protector 300, except that the slant lines 321 may be isolated by the isolated frame 350. Thus, the isolated slant lines 323 may alternately contact the first and second isolated bars 351 and 352 and may be shaped into a plurality of triangular patterns in the pattern area of the isolated frame 350.

The first isolated bar 351 may directly contact the side of the IC structure 200 and the second isolated bar 352 may be spaced apart from the first isolated bar 351 in parallel with the side of the IC structure 200. Thus, the triangular patterns 321 may be arranged in a gap space between the first and the second isolated bars 351 and 352 (e.g., the pattern area of the isolated frame 350).

Thus, the IC structure 200 may be enclosed by a plurality of triangular trust member defined by the first and the second isolated bars 351 and 352 and the connecting bars 353. Accordingly, the second modified warpage protector 302 may be provided as a warpage prevention member WPM that is partially and discontinuously arranged along the side of the IC structure 200.

In the present example embodiment, the warpage prevention member WPM may be arranged at corner portions 200a of the IC structure 200 and central lateral portions of the IC structure 200 may not be covered by the warpage prevention member WPM. That is, no warpage protector may be arranged along the central lateral portions of the IC structure 200.

In such a case, the subsidiary patterns 400 may be arranged in the buffer area S1 between the neighboring warpage prevention members WPM. Accordingly, the process defects in the FEOL process and the BEOL process may be sufficiently detected by using the subsidiary patterns 400 arranged in the buffer area S1.

The warpage prevention member WPM may be arranged any other places along the side of the IC structure 200 as well as the corner portions 200a as long as the warpage prevention member WPM is discontinuously arranged along the side of the IC structure 200. For example, the warpage prevention member WPM may be arranged at the central lateral portions 200b of the IC structure 200, as illustrated in FIG. 7.

In such a case, the subsidiary patterns 400 may be arranged in the buffer area S1 around the corner portions 200a. Thus, the process defects in the FEOL process and the BEOL process may be sufficiently detected by using the subsidiary patterns 400.

Thus, the arrangements of the warpage protector 300 may be varied according to a layout of the IC structure 200, the process conditions of the manufacturing process of semiconductor devices, the configurations of the subsidiary patterns 400 and/or the optimal positions of the subsidiary pattern 400 in the buffer area S1 of the scribe line S.

While the above example embodiments discloses that the warpage protector 300 is configured to have a single layer structure, the warpage protector 300 may also include a multilayer structure in which a plurality of layer structures is stacked in the buffer layer S1 of the scribe line S.

The warpage protector 300 may be selectively formed into a layer structure in the buffer area S1 of the scribe line S in relation with unit processes for forming the IC structure 200. Thus, when the warpage protector 300 may be formed in relation with two or more unit processes for forming the IC structure 200, at least two layer structures may be formed in the buffer area S1 of the scribe line S according to the sequence of the unit processes for forming the IC structure 200. That is, at least two layers may be stacked in the buffer area S1 in accordance with the sequence of the unit processes, thereby forming the multilayered warpage protector 300.

In the present example embodiment, the multilayered warpage protector 300 may include (1) a base warpage protector BWP that is formed simultaneously with the contact pad CP2 and has the same level as the contact pad CP2, (2) a first warpage protector WP1 that is formed simultaneously with the lowermost metal wiring M0 and has the same level as the lowermost metal wiring M0, (3) a second warpage protector WP2 that is formed simultaneously with the upper contact 236 and has the same level as the upper contact 236, and (4) a third warpage protector WP3 that is formed simultaneously with the middle metal wiring M1 and has the same level as the middle metal wiring M1.

For example, because the contact pad CP2 may be lowered from the lower contact 234, the base warpage protector BWP may also be lowered from the first warpage protector WP1. Because the lowermost metal wiring M0, the upper contact 236 and the middle metal wiring M1 are sequentially formed on the memory cell area MC, the first warpage protector WP1 may contact the second warpage protector WP2 and the second warpage protector WP2 may contact the third warpage protector WP3.

In the present example embodiment, the first, the second and the third warpage protectors WP1, WP2 and WP3 may be formed into a single warpage protector 300 that may support an upper portion of the IC structure 200. The base warpage protector BWP may be formed into an additional support member that may support a lower portion of the IC structure 200 regardless the warpage protector 300 having the first, the second and the third warpage protectors WP1, WP2 and WP3.

Most of the thermal deformation of the IC structure 200 may occur at the upper portion of the IC structure 200 because the stack of the metal wiring and the insulation layer may be arranged at the upper portion of the IC structure 200, and thus the difference of the thermal expansions may be relatively greater at the upper portion than the lower portion of the IC structure 200. For that reason, the warpage protector 300 having the first, the second and the third warpage protectors WP1, WP2 and WP3 may be arranged around the upper portion of the IC structure 200 and the base warpage protector BWP may be arranged around the lower portion of the IC structure 200. The configurations and arrangements of the first, the second and the third warpage protectors WP1, WP2 and WP3, and the base warpage protector BWP may vary according to the stress distribution inside the IC structure 200.

Thereafter, a passivation layer (not shown) may be formed on the whole substrate 100 having the chip area C and the scribe line S such that the warpage protector 300 is covered with the passivation layer.

In a modified example embodiment, an upper portion of the warpage protector 300 may be patterned into the aligning key 420. In some example embodiments, the aligning key 420 may be formed in the chip area C, not in the scribe line S, if desired.

According to the above example embodiments of the semiconductor chip 500, the warpage protector 300 may be arranged in the buffer area S1 of the scribe line S around the IC structure 200, thereby sufficiently preventing or minimizing deformation or distortion of the IC structure 200. Therefore, bonding stability and reliability of the multichip package may sufficiently increase due to the minimized distortion of the IC structure 200.

Figure 8:
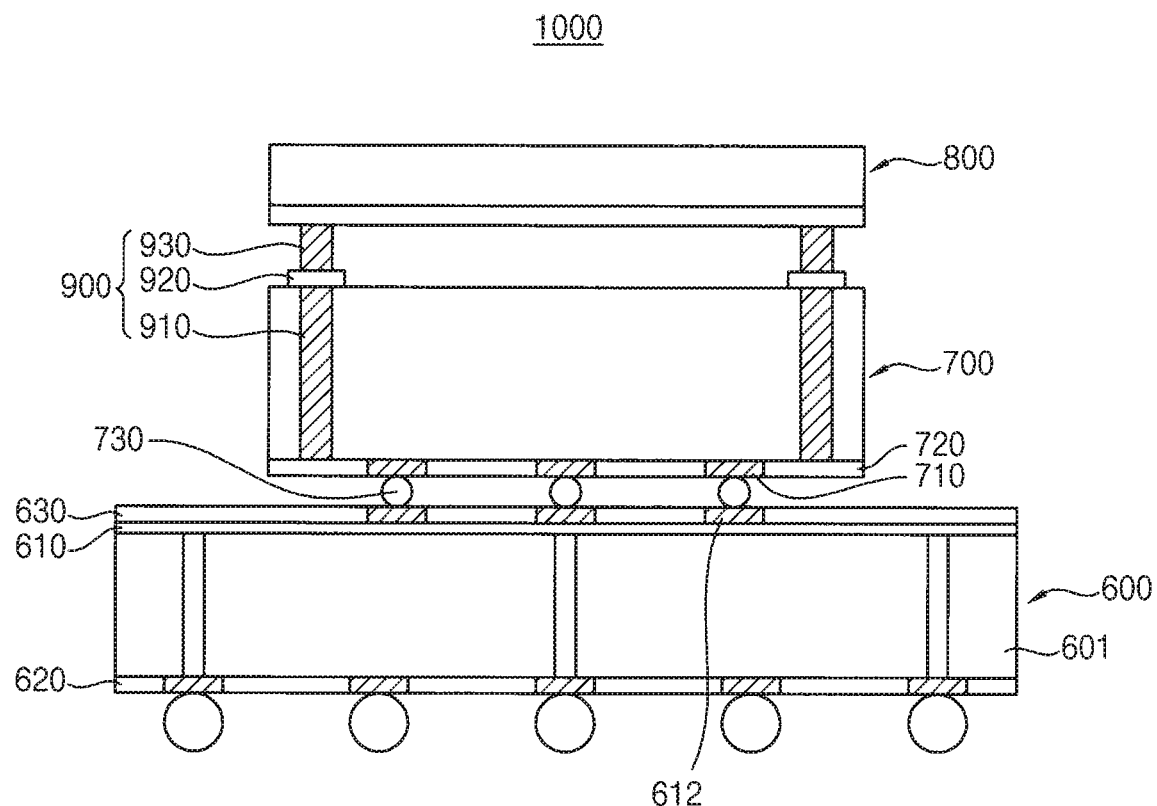
FIG. 8 is a cross sectional view illustrating a semiconductor package including the semiconductor chip shown in FIGS. 1 to 7 in accordance with an example embodiment of the present inventive concepts.

FIG. 8 is a cross sectional view illustrating a semiconductor package including the semiconductor chip shown in FIGS. 1 to 7 in accordance with an example embodiment of the present inventive concepts.

Referring to FIG. 8, a semiconductor package 1000 in accordance with an example embodiment of the present inventive concepts may include a circuit board 600 having a plurality of electric circuits, a first semiconductor chip 700 mounted on and electrically connected to the circuit board 600, and a second semiconductor chip 800 stacked on and electrically connected to the first semiconductor chip 700. As illustrated in FIGS. 1-3, the first and the second semiconductor chips 700 and 800 may include a substrate 100 having a plurality of chip areas C and a line-shaped scribe area S defining the chip areas C, an integrated circuit (IC) structure 200 arranged on the chip area C and having a plurality of transistors, and a plurality of stacked wiring structures connected to the plurality of transistors, and a warpage protector 300 arranged in the scribe line S and supporting a side of the IC structure 200 to thereby prevent or mitigate a warpage of the IC structure 200.

The first and the second semiconductor chips 700 and 800 may have substantially the same structures as the semiconductor chip 500 described in detail with reference to FIGS. 1 to 7. Thus, in FIG. 8, the same reference numerals denote the same elements in FIGS. 1 to 7 and any further detailed descriptions on the first and the second semiconductor chips 700 and 800 will be omitted hereinafter.

While the present example embodiment discloses a multichip package in which a pair of the semiconductor chips 700 and 800 may be stacked on the circuit board 600, the multichip package may include three or more semiconductor chips stacked on the circuit board 600.

The circuit board 600 may include an insulating body 601, an upper circuit pattern 610 on an upper surface of the insulating body 601 and a lower circuit pattern 620 on a lower surface of the insulating body 601 that may be connected to the upper circuit pattern 610 by a body interconnector. The first semiconductor chip 700 may be mounted on the circuit board 600 and be electrically connected to the upper circuit pattern 610 via a plurality of chip pads 710. The second semiconductor chip 800 may be mounted on and connected to the first semiconductor chip 700 via at least an inter-chip connector 900 between the first and the second semiconductor chips 700 and 800.

The first semiconductor chip 700 may include a passivation layer 720 covering an active face thereof and through which the chip pads 710 may be exposed. A plurality of upper contact pads 612 may be partially connected to the upper circuit pattern 610 of the circuit board 600 and an upper surface of the circuit board 600 may be covered by an insulation layer 630 such that the upper circuit pattern 610 may be covered by the insulation layer 630 and the plurality of upper contact pads 612 may be exposed through the insulation layer 630.

A bump structure 730 may contact the chip pad 710, and the upper contact pads 612 may contact the bump structure 730. Thus, the first semiconductor chip 700 may be electrically connected to the circuit board 600 via the bump structure 730. For example, the bump structure 730 may include a solder bump.

For example, the first semiconductor chip 700 may include a memory chip or a control chip, while the second semiconductor chip 800 may include a memory chip such as a flash memory chip or a DRAM chip.

The inter-chip connector 900 may include a penetration electrode 910 penetrating through the first semiconductor chip 700, and a connection bump 930 interposed between the first and second semiconductor chips 700 and 800 and connected to the penetration electrode 910. Further, a re-directional line 920 may be connected with the inter-chip connector 900. The re-directional line 920 may be arranged on a rear surface of the first semiconductor chip 700, and may be connected with the penetration electrode 910 and the connection bump 930.

The second semiconductor chip 800 may be connected to the first semiconductor chip 700 via the connection bump 930 that is connected to the circuit board 600 via the penetration electrode 910. Thus, both of the first and the second semiconductor chips 700 and 800 may be electrically connected to the circuit board 600 via the bump structure 730 and the inter-chip connector 900.

While the present example embodiment discloses that the connection bump 930 is arranged on an active face of the second semiconductor chip 800 and the second semiconductor chip 800 is overturned such that the active face of the second semiconductor chip 800 faces the rear face of the first semiconductor chip 700. The connection bump 930 may be arranged on a rear face of the second semiconductor chip 800 and the penetration electrode 910 may be connected to the connection bump 930 on the second semiconductor chip 800. In such a case, the second semiconductor chip 800 may be stacked on the first semiconductor chip 700 such that the rear face of the semiconductor chip 800 may face the rear face of the first semiconductor chip 700.

Both of the first and second semiconductor chips 700 and 800 may include the warpage protector 300 for supporting a side of each IC structures of the first and the second semiconductor chips 700 and 800. Thus, when the first and the second semiconductor chips 700 and 800 may be bonded to a multichip package, the warpage of each IC structures 200 may be reduced or prevented in the first and the second semiconductor chips 700 and 800 due to the presence of such warpage protectors 300.

The board warpage of the circuit board 600 may be prevented or minimized by an accurate control to a molding process for molding the stack of the first and the second semiconductor chips 700 and 800 to the circuit board 600. Accordingly, the chip warpage and the board warpage may be prevented or minimized in the semiconductor package 1000, thereby increasing reliability and stability of the semiconductor package 1000.

Figure 9:
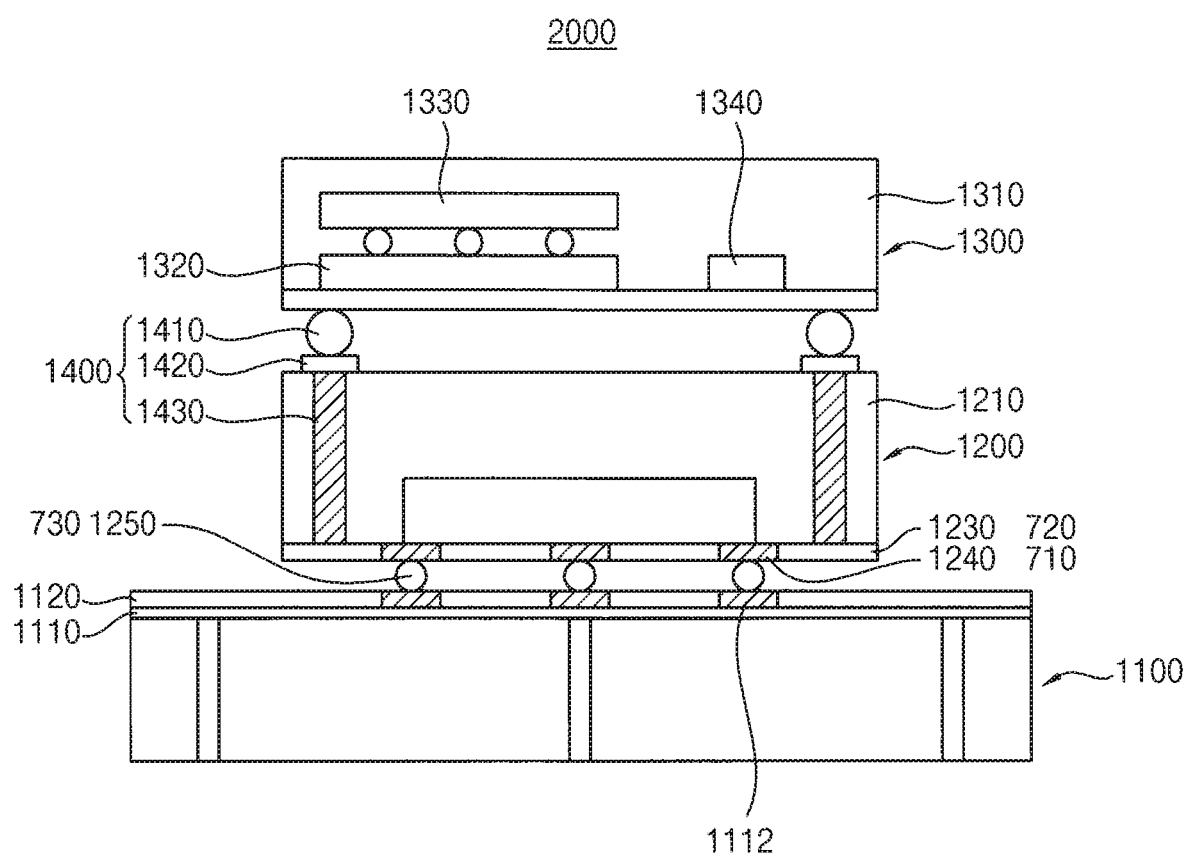
FIG. 9 is a cross sectional view illustrating a semiconductor package including the semiconductor chip shown in FIGS. 1 to 7 in accordance with another example embodiment of the present inventive concepts.

FIG. 9 is a cross sectional view illustrating a semiconductor package including the semiconductor chip shown in FIGS. 1 to 7 in accordance with another example embodiment of the present inventive concepts.

Referring to FIG. 9, a semiconductor package 2000 in accordance with another example embodiment of the present inventive concepts may include a mother board 1100 having a circuit pattern 1110, a system-on-chip (SoC) package 1200 mounted on the mother board 1100 and having a single operational chip 1220, and a multichip package 1300 mounted on the SoC package 1200 and having a controller 1340 and at least a memory chip.

The mother board 1100 may include various active devices and passive devices together with various system control terminals, and the operational chip 1220 and the memory chips 1320 and 1340 may be electrically connected to various components of an electronic system (not shown) through the mother board 1100.

The circuit pattern 1110 may be arranged in and/or on the mother board 1100 and may be connected to terminal elements of the components of the electronic system. Thus, the terminal elements of the components may be electrically connected to the operational chip 1220 of the SoC chip 1200 through the mother board 1100 and may be controlled under operational algorithms of the operational chip 1220, thereby systematically synthesizing the components into the electronic system.

For example, the mother board 1100 may include a base board of a computer system and a smart phone and the components may include an output system such as a display and a printer, an input system such as a keyboard and a touch screen and a communication port.

A plurality of connection ports 1112 may be connected to the circuit pattern 1110 on the mother board 1100 and the circuit pattern 1110 may be covered by an insulation layer 1120 such that the connection ports 1112 may be exposed through the insulation layer 1120.

A plurality of processors, which may conduct various functions independently in the semiconductor package 2000, may be built in a single chip of the SoC package 1200, so that the SoC package 1200 may function as an operating system (OS) of the electronic system having the semiconductor package 2000.

For example, the SoC package 1200 may include the operational chip 1220, a first package board 1210 on which the operational chip 1220 may be mounted, a first insulation layer 1230, a first contact pad 1240 and a first bump structure 1250. For example, various processors and units for operating a mobile system may be built and integrated in the operational chip 1220 and thus the operational chip 1220 may function as an application processor (AP) of the mobile system. For example, the operational chip 1220 may include a central process unit (CPU) in which operational algorithms for operating the mobile system may be programmed, a graphic process unit (GPU) for accelerating the graphic data signal process, a video image en/decoding processor, a digital signal processor and various system interfaces.

The SoC package 1200 may be manufactured by a system-on-chip packaging process.

For example, the operational chip 1220 may have substantially the same structures as one of the semiconductor chips 500 shown in FIGS. 1 to 7. Thus, the operational chip 1220 may include a chip substrate having a plurality of chip areas and a line-shaped scribe area defining the chip areas, an integrated circuit (IC) structure arranged on the chip area and having a plurality of transistors and a plurality of stacked wiring structures connected to the plurality of transistors and a warpage protector arranged in the scribe line and supporting a side of the IC structure to thereby prevent or mitigate the IC structure from a warpage.

Thus, the warpage of the operational chip itself 1220 may be sufficiently prevented or minimized in the SoC packaging process due to warpage protector 300, thereby increasing the reliability and stability of the SoC package 1200.

The chip substrate, the IC structure and the warpage protector of the operational chip 1220 may have substantially the same structures as the substrate 100, the IC structure 200 and the warpage protector 300 of the semiconductor chip 500, so that any detailed descriptions on the chip substrate, the IC structure and the warpage protector of the operational chip 1220 will be omitted hereinafter.

The SoC package 1200 may be connected to the mother board 1100 via the first bump structure 1250. For example, the first bump structure 1250 may include a solder bump. However, any other conductive connectors may also be used as well as the first bump structures as long as the SoC package 1200 may be electrically connected to the mother board 1100.

The multichip package 1300 may include an embedded multichip package (eMCP) in which the controller 1340 and at least a memory chip may be built and may be mounted on the SoC package 1200. Thus, the SoC package 1200 and the multichip package 1300 may be provided into a package on package structure.

For example, the multichip package 1300 may include a second package board 1310, a DRAM device 1320, a NAND memory device 1330 and controllers 1340.

The DRAM device 1320 and the NAND memory device 1330 may be stacked in substantially the same structures as the multichip package 1000 shown in FIG. 8. The NAND memory device 1330 may be controlled by the controller 1350 on the same second package board 1310, so that the multichip package 2000 may function as an embedded multimedia card (eMMC).

For example, the DRAM device 1320 and the NAND memory device 1330 may include one of the semiconductor chips 500 described in detail with reference to FIGS. 1 to 7. Thus, each of the DRAM device 1320 and the NAND memory device 1330 may include a chip substrate having a plurality of chip areas and a line-shaped scribe area defining the chip areas, an integrated circuit (IC) structure arranged on the chip area and having a plurality of transistors and a plurality of stacked wiring structures connected to the plurality of transistors and a warpage protector arranged in the scribe line and supporting a side of the IC structure to thereby prevent or mitigate the IC structure from a warpage.

The chip substrate, the IC structure and the warpage protector of the o DRAM device 1320 and the NAND memory device 1330 may have substantially the same structures as the substrate 100, the IC structure 200 and the warpage protector 300 of the semiconductor chip 500, so that any detailed descriptions on the chip substrate, the IC structure and the warpage protector of the DRAM device 1320 and the NAND memory device 1330 will be omitted hereinafter.

Thus, the warpage of the DRAM device 1320 and the NAND memory device 1330 themselves may be sufficiently prevented or minimized in the packaging process for manufacturing the multichip package 1300 due to warpage protector, thereby increasing the reliability and stability of the multichip package 1300.

The SoC package 1200 and the multichip package 1300 may constitute the package on package and an inter-package connector 1400 may electrically connect the SoC package 1200 with the multichip package 1300 in the package on package.

For example, the inter-package connector 1400 may include a second bump structure 1410, a re-directional line 1420 and a penetration electrode 1430 penetrating through the first package board 1210 of the SoC package 1200.

The multichip package 1300 may be electrically connected to the SoC package 1200 via the inter-package connector 1400 and the SoC package 1200 may be electrically connected to the mother board 1100 via the first bump structure 1250. Thus, the SoC package 1200 and the multichip package 1300 may be mounted on the mother board 1100 and the SoC package 1200, the multichip package 1300 and the mother board 1100 may be electrically connected from one another as a single package on package system.

Since the operational chip 1220, the DRAM device 1320 and the NAND memory device 1330 may be protected from their own warpage, the chip warpage of the operational chip 1220, the DRAM device 1320 and the NAND memory device 1330 may be sufficiently prevented in the package process for manufacturing the semiconductor package 2000 as the package on package system, thereby sufficiently increasing the operational reliability and the system stability of the semiconductor package 2000.

While the present example embodiment discloses the package on package system in which a plurality of the semiconductor packages is stacked on the mother board, the present inventive concepts might also be applied to any other package systems as well as the package on package system as long as the package system may just include the semiconductor chips described in detail with reference to FIGS. 1 to 7.

According to the example embodiments of the semiconductor chip and the multichip package including the same, the warpage protector may be provided along the side of the semiconductor chip and integrally with the semiconductor chip in one body, so that the warpage or distortion of the semiconductor chip caused by the internal stresses and strains of the semiconductor chip may be sufficiently prevented. That is, the warpage of the semiconductor itself may be sufficiently prevented by the warpage protector of the semiconductor chip.

For example, since the stack number or the height of the metal wirings in the semiconductor chip tends to increase as the recent requirements of high performance and small size of the recent semiconductor chips, the chip warpage of the semiconductor chip itself also tends to increase significantly. Thus, the conventional dies or the bare chips, the conventional semiconductor chips individually cut from the wafer, are usually distorted or changed in shape, which causes significant package defects in the subsequent packaging process for manufacturing the semiconductor package having the conventional bare chips.

However, the chip warpage of the present example embodiment of the semiconductor chips may be sufficiently protected by the warpage protector enclosing and integrally combined to the semiconductor chip, so that the bonding stability of the bare chips may be significantly improved and thus the package reliability of the semiconductor package having the semiconductor chips may be sufficiently increased.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor chip comprising:
a substrate including a plurality of chip areas and a line-shaped scribe area defining the chip areas;
an integrated circuit (IC) structure on the chip area, the IC structure including a plurality of transistors and a plurality of stacked wiring structures connected to the transistors; and
a warpage protector in the line-shaped scribe area and corresponding to the stacked wiring structures, the warpage protector supporting at least one side of the IC structure, the warpage protector including a first bar, a second bar, and a support pattern between the first bar and the second bar, the first bar in contact with the side of the IC structure, the second bar spaced apart from and in parallel with the first bar, the support pattern including a plurality of slant lines that are slanted at an angle with respect to the first and second bars and are continuously and alternately in contact with the first and second bars in a zigzag pattern.

2. The semiconductor chip of claim 1, wherein the plurality of slant lines are spaced apart from each other by a same distance along the first and the second bars.

3. The semiconductor chip of claim 1, wherein the plurality of slant lines form a plurality of triangular patterns continuously extending along the first and the second bars.

4. The semiconductor chip of claim 1, wherein the stacked wiring structures include,
a lowermost wiring connected to the transistors via a lower contact,
at least a middle wiring over the lowermost wiring and connected to the lowermost wiring via an upper contact, and
an uppermost wiring over the middle wiring and connected to the middle wiring via a via structure; and
the warpage protector includes a multilayer structure, the multilayer structure including,
a first warpage protector layer at a same level as the lowermost wiring,
a second warpage protector layer in contact with the first warpage protector layer, the second warpage protector layer being at a same level as the upper contact, and
a third warpage protector layer in contact with the second warpage protector layer, and the third warpage protector layer being at a same level as the middle wiring.

5. The semiconductor chip of claim 4, wherein the stacked wiring structures include,
a peripheral connection plug connecting the lowermost wiring to a transistor, which is at a peripheral area of each of the chip areas, via a contact pad, and
a cell connection plug connecting the lowermost wiring to the substrate at a memory cell area of each of the chip areas via the lower contact; and
the warpage protector further includes a base warpage protector layer that is at a same level as the contact pad.

6. The semiconductor chip of claim 5, wherein the first warpage protector layer, the second warpage protector layer, and the third warpage protector layer include one of copper (Cu) and aluminum (Al) and the base warpage protector layer includes any one of titanium (Ti), tantalum (Ta) and tungsten (W).

7. The semiconductor chip of claim 1, wherein a pair of the first bar and the second bar and at least one of the plurality of slant lines provided between the first bar and the second bar are at a corner portion of the IC structure.

8. The semiconductor chip of claim 1, wherein a pair of first bar and the second bar and at least one of the plurality of slant lines provided between the first bar and the second bar are at a central portion of the IC structure.

9. The semiconductor chip of claim 1, further comprising:
at least a subsidiary pattern in the line-shaped scribe area of the substrate for inspecting process defects in a manufacturing process for manufacturing the semiconductor chip and in a packaging process for manufacturing a semiconductor package having the semiconductor chip.

10. The semiconductor chip of claim 9, wherein the subsidiary pattern includes at least one of an aligning key pattern, an overlay key pattern, a test element group (TEG) pattern, or an optical critical dimension (OCD) pattern.

11. A semiconductor package comprising:
a circuit board including an electric circuit pattern;
a first semiconductor chip on the circuit board and electrically connected to the circuit board; and
a second semiconductor chip on the first semiconductor chip and electrically connected to the first semiconductor chip, each of first and the second semiconductor chips including,
a substrate including a plurality of chip areas and a line-shaped scribe area defining the chip areas, an integrated circuit (IC) structure on the chip area, the IC structure including a plurality of transistors and a plurality of stacked wiring structures connected to the transistors, and a warpage protector in the line-shaped scribe area and corresponding to the stacked wiring structures, the warpage protector supporting at least a side of the IC structure, the warpage protector including a first bar, a second bar, and a support pattern between the first bar and the second bar, the first bar in contact with the side of the IC structure, the second bar spaced apart from and in parallel with the first bar, the support pattern including a plurality of slant lines that are slanted at an angle with respect to the first and second bars and are continuously and alternately in contact with the first and second bars in a zigzag pattern.

12. The semiconductor package of claim 11, further comprising:
a bump structure connecting the circuit board to the first semiconductor chip; and
an inter-chip connector connecting the first semiconductor chip to the second semiconductor chip.

13. A semiconductor package comprising:
a mother board including an electronic circuit pattern;
a system on chip (SoC) package on the mother board, the SOC package including an operational chip, the operational chip including one or more microprocessors; and
a multichip package on the SoC package, the multichip package including a controller and at least one memory chip, each of the operational chip and the memory chip including,
a substrate including a plurality of chip areas and a line-shaped scribe area defining the chip areas,
an integrated circuit (IC) structure on each of the chip area areas, the IC structure including a plurality of transistors and a plurality of stacked wiring structures connected to the transistors, and
a warpage protector in the line-shaped scribe area and corresponding to the stacked wiring structures, the warpage protector supporting at least one side of the IC structure, the warpage protector including a first bar, a second bar, and a support pattern between the first bar and the second bar, the first bar in contact with the side of the IC structure, the second bar spaced apart from and in parallel with the first bar, the support pattern including a plurality of slant lines that are slanted at an angle with respect to the first and second bars and are continuously and alternately in contact with the first and second bars in a zigzag pattern.

14. The semiconductor package of claim 13, wherein:
the operational chip includes an application processor (AP); and
the memory chip includes at least one dynamic random access memory (DRAM) chip and at least one flash memory chip stacked on the DRAM chip.

15. The semiconductor package of claim 14, further comprising:
a bump structure connecting the mother board to the system on chip (SoC) package; and
a penetration electrode connecting the system on chip (SoC) package and the multichip package.

16. The semiconductor chip of claim 1, the line-shaped scribe area includes a kerf area and a buffer area around the kerf area, and the warpage protector is in the buffer area.

17. The semiconductor chip of claim 1, the line-shaped scribe area includes a kerf area and a buffer area around the kerf area, the first bar and the second bar are in the buffer area, and the second bar faces the kerf area.

18. The semiconductor package of claim 11, the line-shaped scribe area includes a kerf area and a buffer area around the ken area, and the warpage protector is in the buffer area.

19. The semiconductor package of claim 11, the line-shaped scribe area includes a kerf area and a buffer area around the ken area, the first bar and the second bar are in the buffer area, and the second bar faces the ken area.

* * * * *